(12) United States Patent
Yoo

(10) Patent No.: US 6,798,795 B2
(45) Date of Patent: Sep. 28, 2004

(54) ULTRA-COMPACT ROOM TEMPERATURE RAPIDLY TUNABLE INFRARED SOURCES

(75) Inventor: Sung-Joo Yoo, Davis, CA (US)

(73) Assignee: The Regents of the University of California, Oakland, CA (US)

(*) Notice: Subject to any disclaimer, the term of this patent is extended or adjusted under 35 U.S.C. 154(b) by 132 days.

(21) Appl. No.: 09/796,993

(22) Filed: Feb. 28, 2001

(65) Prior Publication Data

US 2001/0033723 A1 Oct. 25, 2001

Related U.S. Application Data

(60) Provisional application No. 60/185,643, filed on Feb. 29, 2000.

(51) Int. Cl.[7] .................................................. H01S 3/10
(52) U.S. Cl. ........................ 372/20; 385/122; 385/131; 359/332; 359/350
(58) Field of Search ........................... 372/20; 385/122, 385/131; 359/350, 332

(56) References Cited

U.S. PATENT DOCUMENTS

| | | | |
|---|---|---|---|
| 5,321,718 A | 6/1994 | Waarts et al. | |
| 5,434,700 A | 7/1995 | Yoo | |
| 5,796,902 A | 8/1998 | Bhat et al. | 385/122 |
| 5,802,232 A | * 9/1998 | Bhat et al. | 385/122 |
| 5,912,910 A | 6/1999 | Sanders et al. | |

OTHER PUBLICATIONS

Faist, J. et al., "High–Power Continous–Wave Quantum Cascade Lasers", IEEE Journal of Quantum Electronics, vol. 34, No. 2, Feb. 1998, pp. 336–343.

Mason, B. et al., "Widely Tunable Sampled Grating DBR Laser with Integrated Electroabsorption Modulator", IEEE Photonics Technology Letters, vol. 11, No. 6, Jun. 1999, pp. 638–640.

Shim, J. et al., "Refractive Index and Loss Changes Produced by Current Injection in InGaAs(P)–InGaAsP Multiple Quantum–Well (MQW) Waveguides", IEEE Journal of Selected Topics in Quantum Electronics, vol. 1, No. 2, Jun. 1995, pp. 408–415.

(List continued on next page.)

Primary Examiner—Tan Ho
Assistant Examiner—James Menefee
(74) Attorney, Agent, or Firm—John P. O'Banion

(57) ABSTRACT

An ultra-compact, room-temperature, continuous-wave infrared source that can rapidly tune over a very wide spectral range. The targeted spectral overages are 3 $\mu$m to 4 $\mu$m, 4 $\mu$m to 6 $\mu$m, 6 $\mu$m to 8 $\mu$m, and 8 $\mu$m to 12 $\mu$m. The spectral width of the infrared idler is expected to be ~10 MHz. In particular, the invention is a monolithically integrated device which requires no external pump lasers or bulk optics for its operation. The invention uses difference-frequency-generation in a highly nonlinear optical semiconductor waveguide with which high power semiconductor lasers are integrated to internally provide the tunable pump and signal waves.

55 Claims, 9 Drawing Sheets

OTHER PUBLICATIONS

Chan, M. et al., "The Effect of Carrier–Induced Change on the Optical Properties of AlGaAs–GaAs Intermixed Quantum Wells", IEEE Journal of Selected Topics n Quantum Electronics, vol. 4, No. 4, Jul./Aug. 1998, pp. 685–694.

Neber, S. et al., "Tunable laser diodes with type II superlattice in the tuning region", Semicond. Sci. Technol. 13, 1998, pp. 801–805.

Yoo et al., "Wavelength conversion by difference frequency generation in AlGaAs waveguides with periodic domain inversion achieved by wafer bonding", Appl. Phys. Lett. 68 (19), May 1996, pp. 2609–2611.

Yoo et al., "Quasi–phase–matched second–harmonic generation in AlGaAs waveguides with periodic domain inversion achieved by wafer bonding", Appl. Phys. Lett. 66 (25), Jun. 1995, pp. 3410–3412.

Xu et al., "Semiconductor quasiphase matched wavelength converters", Lasers and Electro–optics 1997, CLEO/Pacific Rim '97, Proceedings of pacific rim conference on CHIBA, Jul. 1997, pp. 229–230.

Borenstain, S., "Generating far–infrared radiation by two-wave mixing", Applied Optics, Optical Society of America, vol. 32, No. 6, Feb. 1993, p. 790.

* cited by examiner

ULTRA-COMPACT ROOM TEMPERATURE RAPIDLY TUNABLE INFRARED SOURCES

CROSS-REFERENCE TO RELATED APPLICATIONS

This application claims priority from U.S. provisional application Ser. No. 60/185,643 filed on Feb. 29, 2000 and incorporated herein by reference.

STATEMENT REGARDING FEDERALLY SPONSORED RESEARCH OR DEVELOPMENT

REFERENCE TO A MICROFICHE APPENDIX

Not Applicable

BACKGROUND OF THE INVENTION

1. Field of the Invention

This invention pertains generally to infrared sources, and more particularly to an ultra-compact, room temperature, continuous-wave, rapidly tunable infrared source.

2. Description of the Background Art

Tunable sources in the infrared spectral region are important for a number of applications, including remote sensing of trace gases. Compact infrared sources operating at room temperature are especially attractive for demanding Department of Defense (DoD) operations requiring high mobility and reliability on both ground-based and aircraft platforms. In many cases, the infrared sources must be able to rapidly tune over a wide spectral range to achieve high-speed measurements on many trace gases.

Although recent research on Quantum Cascade lasers, Type-II lasers, and Solid-state Optical Parametric Oscillators (OPO) have demonstrated impressive results, none of those infrared sources currently offer the desired characteristics listed above. Both Quantum Cascade lasers and Type-II lasers show high power continuous wave operations at cryogenic temperatures; however, their performance degrades at higher temperatures and, further, they cease to operate continuous-wave (CW) at room temperature. Their tunability is also limited by narrow spectral widths, and only relatively slow thermal tuning have been demonstrated. Solid-state OPOs, on the other hand, perform very well at room temperature; however, they require sophisticated bulk-optics alignment between the diode pump laser, the solid-state laser, and the OPO resonator. In addition, their line widths tend to be too broad to resolve dense trace gas lines, and they cease to operate unless the pump power levels are maintained above the threshold in the multiple watt levels.

Accordingly, there is a need for a continuous-wave infrared source that is ultra-compact, rapidly tunable, and operable at room temperature. The present invention satisfies those needs, as well as others, and overcomes deficiencies inherent in conventional infrared sources.

BRIEF SUMMARY OF THE INVENTION

The present invention comprises an ultra-compact, room-temperature, continuous-wave infrared source that can rapidly tune over a very wide spectral range. More particularly, the invention comprises a monolithically integrated device which requires no external pump lasers or bulk optics for its operation. Accordingly, an aspect of the invention is difference-frequency-generation in a highly nonlinear optical semiconductor waveguide with which high power semiconductor lasers can be integrated to internally provide the tunable pump and signal waves.

By way of example, and not of limitation, the invention can achieve a wide tuning range covering one or multiples of the following approximate infrared ranges: 3 $\mu$m to 4 $\mu$m, 4 $\mu$m to 6 $\mu$m, 6 $\mu$m to 8 $\mu$m, and 8 $\mu$m to 12 $\mu$m. The spectral width of the infrared idler is approximately 10 MHz. The invention employs zinc-blende semiconductors such as GaAs and InP which are excellent nonlinear optical materials as well as superb laser materials. They offer high nonlinear optical susceptibilities (e.g. $\chi^{(2)}_{GaAs}$=180 pm/V), wide transparency in the infrared (approximately 0.9 $\mu$m to approximately 14 $\mu$m for GaAs), high damage threshold (approximately 10 MW/cm$^2$, inside the facet), and single mode lasing at power levels above approximately 1.0 W. For efficient nonlinear optical processes, advanced material processes, including wafer-scale bonding and atomic-scale planarization, are employed to realize a semiconductor waveguide with patterned crystal orientation for quasi-phasematched interactions. Further, the invention exhibits idler tuning over a wide spectral range by tuning the two laser emission wavelengths.

An object of the invention is to realize an infrared source operating at room temperature and capable of rapidly tuning over a wide wavelength range in an extremely compact and robust device structure.

Another object of the invention is to provide a device that will operate at room temperature, tune over wide infrared wavelengths, and be housed in a self-contained compact package.

Another object of the invention is to provide a compact integrated nonlinear device that achieves room temperature CW operation.

Another object of the invention is to provide a compact integrated nonlinear go device that achieves tunable infrared emission covering the following approximate wavelength ranges: 3 $\mu$m to 4 $\mu$m, 4 $\mu$m to 6 $\mu$m, 6 $\mu$m to 8 $\mu$m, and 8 $\mu$m to 11 $\mu$m.

Another object of the invention is to provide a compact integrated nonlinear device that achieves a rapid tuning speed of several nanoseconds for tuning from one desired wavelength to another.

Another object of the invention is to provide a compact integrated nonlinear device in a compact device module of approximately 1 cm in length, which contains tunable pump and signal lasers, a MMI coupler, and a nonlinear waveguide.

Another object of the invention is to provide a compact integrated nonlinear device for approximately 3 $\mu$m to approximately 4 $\mu$m on wavelengths that achieves an approximate 100 mW infrared output if approximately 1 W pump and approximately 1 W signal waves are coupled into the waveguide with a loss coefficient of approximately 2 dB/cm at every wavelength.

Another object of the invention is to provide a compact integrated nonlinear device for approximately 8 $\mu$m to approximately 11 $\mu$m wavelengths that achieves an approximate 26 mW infrared output if approximate 1 W pump and approximate 1 W signal waves are coupled into the waveguide with a loss coefficient of approximately 2 dB/cm at every wavelength.

Another object of the invention is to provide a room-temperature, continuous-wave tunable infrared source that can rapidly (e.g., less than approximately 10 nanoseconds) tune over a very wide spectral range (greater than approximately 25% of the center wavelength).

Another object of the invention is to provide a continuous-wave tunable infrared source having approximate spectral coverage ranges from 3 µm to 4 µm, 4 µm to 6 µm, 6 µm µm to 8 µm, and 8 µm to 12 µm.

Another object of the invention is to provide a continuous-wave tunable infrared source wherein the spectral width of the infrared idler is approximately 10 MHz.

Another object of the invention is to provide a monolithically integrated infrared source which requires no external pump lasers or bulk optics for its operation.

Another object of the invention is to provide for difference-frequency-generation in a highly nonlinear optical semiconductor waveguide with which high power semiconductor lasers are integrated to internally provide the tunable pump and signal waves.

Another object of the invention is to provide a highly nonlinear optical semiconductor waveguide with which high power semiconductor lasers are integrated to internally provide the tunable pump and signal waves based on difference-frequency-generation.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to FIG. 1 through FIG. 14 of the drawings, for illustrative purposes the present invention is embodied in the apparatus and methods generally described herein. It will be appreciated that the apparatus may vary as to configuration and as to details of the parts, and that the method may vary as to the specific steps and sequence, without departing from the basic concepts as disclosed herein.

1. Difference Frequency Generation in Periodically Domain Inverted Waveguides

Figure 1:
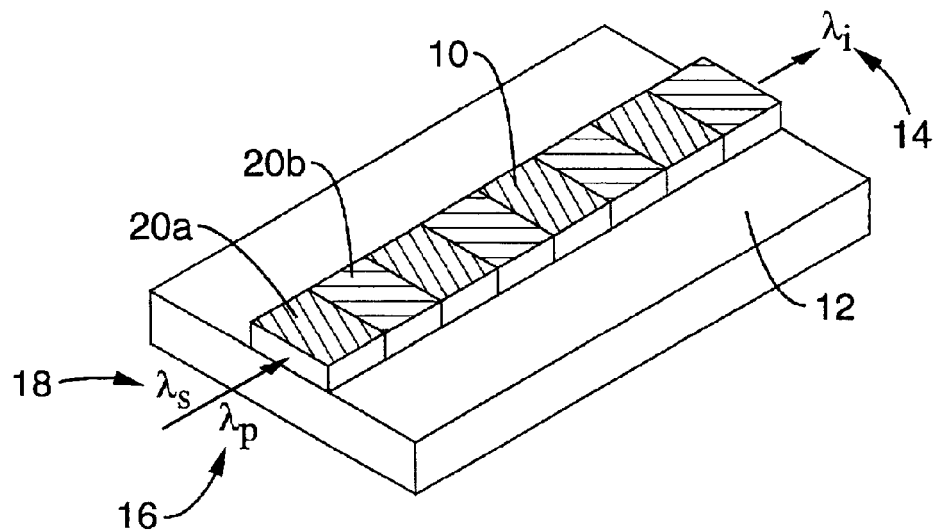
FIG. 1 is a schematic diagram of a quasi-phasematched waveguide with patterned crystal orientation according to the present invention.

Referring first to FIG. 1, an aspect of the invention is difference-frequency-generation in a highly nonlinear optical semiconductor waveguide with which high power semiconductor lasers can be integrated to internally provide the tunable pump and signal waves. The tunable infrared wave is generated by difference frequency mixing in a semiconductor nonlinear optical waveguide 10 which, in FIG. 1, is shown fabricated on a substrate base 12. The generated infrared wave (idler) has a wavelength corresponding to the frequency difference between the pump and the signal frequencies. In other words, $1/\lambda_i = 1/\lambda_p - 1/\lambda_s$, where $\lambda_i$, $\lambda_p$, and $\lambda_s$ are the wavelengths of the idler 14, pump 16, and signal 18 waves, respectively.

Due to dispersion in the waveguide 10, the phase velocities of the interacting waves are not matched for efficient nonlinear interactions. The power flow from one wave to the other is determined by the relative phase between the waves, and the differing phase velocities between the interacting waves lead to an alternation of the power flow. The alternation of the sign of power flow results in repetitive growth and decay of the generated idler power along the length of interaction. The distance over which the relative phase changes by π is called the coherence length.

The present invention addresses this inherent mismatching by employing a quasi-phasematching technique. This technique involves repeated modulation of the sign of the nonlinear susceptibility after each propagation through the coherence length. In crystal optics, reversal of the sign of the nonlinear susceptibility can be achieved by inversion of the crystallographic orientations.

Therefore, in the present invention, waveguide 10 is fabricated with periodical patterning of semiconductor crystal orientation for quasi-phasematched nonlinear optical interaction. FIG. 1 illustrates the semiconductor nonlinear optical waveguide 10 with segments 20a, 20b of alternating patterned crystal orientation. Fabrication of such a waveguide is achieved by applying combined processes of wafer-bonding and epitaxial regrowth as discussed below.

Using such an approach, the present invention achieves non-degenerate difference-frequency generation of the infrared radiation in the targeted wavelength ranges of 3 µm to 4 µm, 4 µm to 6 µm, 6 µm to 8 µm, and 8 µm to 12 µm using GaAs substrates. While the wide transparency range of GaAs implies that the device can potentially cover the entire mid-IR spectrum of 3 µm to 14 µm, it is difficult to realize a device achieving high efficiency over such a wide spectral range due to phase matching and mode-overlap considerations. Therefore, the preferred embodiments of the present invention are devices with optimum performances in one or a few of the narrower wavelength ranges listed above.

2. Integrated Lasers and Waveguide

Figure 2:
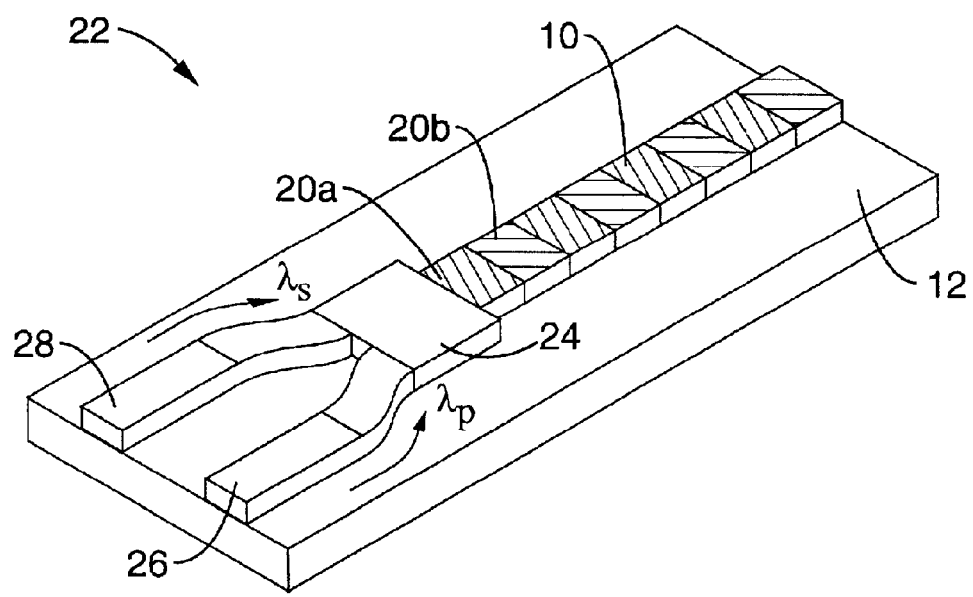
FIG. 2 is a schematic diagram of a quasi-phasematched waveguide with patterned crystal orientation as shown in FIG. 1, with integrated lasers according to the invention.

While the device depicted in FIG. 1 achieves the desired IR generation through the nonlinear optical interaction between the pump 16 and the signal 18 waves coupled into the waveguide, improved performance can be achieved from an alternative embodiment wherein the pump and the signal lasers are on the same chip as the nonlinear waveguide. FIG. 2 shows such an integrated device 22. This embodiment of the invention includes a Multi-Mode-Interference (MMI) on-chip coupler 24 for efficiently coupling emissions from the tunable pump 26 and signal 28 lasers into the nonlinear waveguide 10.

Benefits of such integration are multi-fold. First, the laser emission needs no bulk coupling optics which accompany typical insertion losses of approximately 4 dB to approximately 6 dB going from a diode laser to a semiconductor waveguide. Since the output power of the idler wave is proportional to the product of the pump and the signal optical powers, the total loss is approximately 8 dB to 12 dB for the generated IR. On the other hand, MMI couplers typically achieve approximately 1 dB loss, and the total effective loss becomes approximately 2 dB for the IR idler wave. Hence, an approximately 6 dB to 10 dB improvement in conversion efficiency in the integrated device shown in FIG. 2 is achieved as compared to using discrete devices. Second, the integrated device shown in FIG. 2 is mechanically robust and physically compact. The inventive integrated device requires no bulk optics alignment nor maintenance of such alignment. This makes a strong contrast to typical bulk OPOs requiring a careful alignment of a nonlinear crystal, cavity mirrors, a Nd:YAG rod, diode lasers, and lenses. Third, room temperature or higher temperature operation can be achieved due to the fact that GaAs or InP based semiconductor lasers can be utilized to provide the pump 26 and the signal 28 waves for the semiconductor nonlinear optical waveguide 10. For example, GaAs based semiconductor lasers already exist that can operate at temperatures as high as above approximately 238° C. with $T_0$ above approximately 300° C.

For the desired idler wavelengths in the infrared region, there can be many combinations of pump and signal wavelengths. In the present invention, the pump and signal wavelengths are chosen so that excellent room-temperature operation can be achieved in semiconductor lasers emitting those wavelengths. Of those wavelengths, the preferred wavelengths are on the order of 780 nm, 850 nm, 980 nm, and 670 nm utilizing GaAs substrates, and on the order of 1310 nm and 1550 nm utilizing InP substrates. Note that, by tuning both the pump and signal wavelengths, a very wide idler tuning range in the infrared can be achieved. For example, 770 nm pump and 990 nm signal waves can mix to generate a 3.5 µm idler wave, and the tuning of the idler over a range from 3.16 µm to 3.82 µm can be achieved by tuning both the 770 nm and 990 nm lasers by +/−10 nm each in the opposite directions. Similarly, 780 nm pump and 850 nm signal waves can generate a 10 µm idler wave, which can tune between 7.4 µm and 13.3 µm by tuning both 780 nm and 850 nm lasers by +/−10 nm each.

Figure 3:
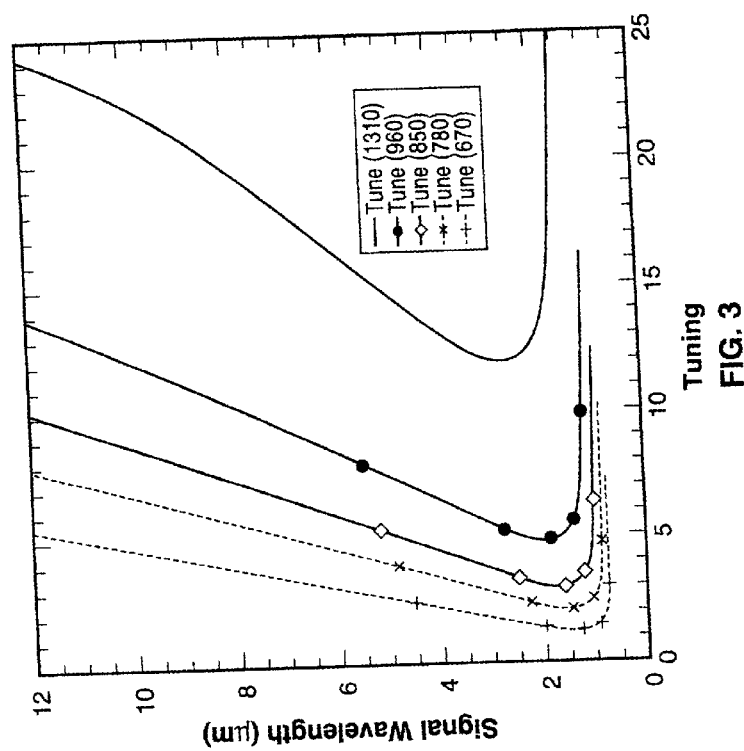
FIG. 3 is a graph showing parametric tuning curves for a AlGaAs waveguide according to the invention pumped by five different pump wavelengths (1310 nm, 980 nm, 850 nm, 780 nm, and 670 nm).
Figure 4:
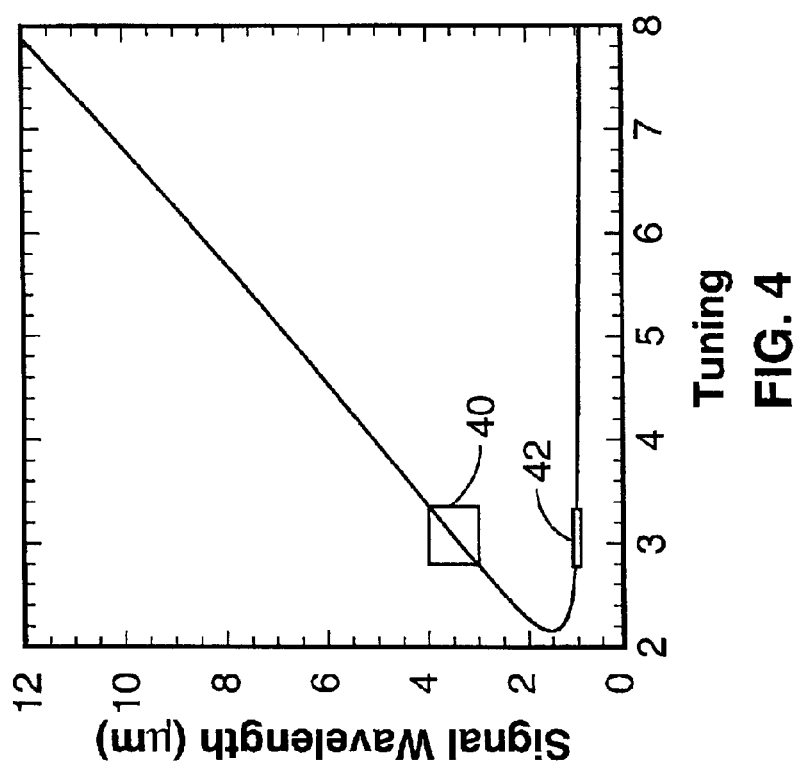
FIG. 4 is a graph showing parametric tuning curves for a AlGaAs waveguide according to the invention pumped at 770 nm.

The wavelength tunings described in the examples above induce small phase-mismatch in the nonlinear interactions due to their deviation from the designed quasi-phasematching condition, and this phase-mismatch can be corrected by modifying the quasi-phasematching condition during the wavelength tuning. Such a modification is possible, for instance, by injecting a current into the nonlinear waveguide or by applying an electrical bias. FIG. 3 shows parametric tuning curves of a designed AlGaAs waveguide for five different pump wavelengths (1310 nm, 980 nm, 850 nm, 770 nm, and 670 nm), and FIG. 4 shows the tuning curve for a 770 nm pump. The abscissa "Tuning" in both figures indicates relative tuning in the injected current or the electrical bias required to maintain the desired (e.g., "perfect") quasi-phasematching condition. Note that it is always possible to utilize an alternate grating periodicity to offset the detuning, and the grating period should be chosen to provide the largest tunability in the desired spectral region.

The rectangular windows 40 and 42 in FIG. 4 also indicate how much tuning of the signal wavelength is required to achieve the idler tuning between 3 µm and 4 µm, provided that the pump wavelength is maintained at 770 nm. During the course of this idler wavelength tuning from 3 µm to 4 µm, the quasi-phasematching tuning parameter must also tune by 2.8 µm to 3.4 µm, which corresponds to tuning of the phase-mismatch parameter $$\Delta k = (k_{pump}^{TE} - k_{signal}^{TE} - k_{idler}^{TM})$$

by 0.20 µm$^{-1}$. This is easily accommodated by either current injection or by reverse biasing the nonlinear optical waveguide. The latter is the preferred method since it induces negligible excess heating or optical loss.

In the case of current tuning, this tuning requirement corresponds to a reasonable current density of 51 kA/cm$^2$ for bulk GaAs, assuming carrier lifetime of 1 nsec, free carrier plasma relations, and typical material characteristics. In this regard, note that the current requirement is significantly reduced for quantum well structures, so quantum well structures that offer a large tuning for the least amount of current could be do used as an alternative. In particular, note that this tuning relates to the phase mismatch term being proportional to $$\Delta k = (k_{pump}^{TE} - k_{signal}^{TE} - k_{idler}^{TM})$$

and that both polarization and dispersion must be carefully considered since the signal and the pump waves will be in the TE polarization and the idler in the TM. Therefore, both dispersion and birefringence should be considered in designing the tuning elements. In particular, it may be possible to employ strained quantum wells for achieving enhanced sensitivities in dispersion or birefringence just below its bandgap.

The tuning by current injection approach offers effective and rapid tuning of the quasi-phasematching condition to cover the wide IR spectrum. However, it may also be possible to employ an alternative fast tuning mechanism such as electro-optical tuning by an external bias field. Such a method could have the advantage of inducing no excess free-carrier loss or power dissipation. The electro-optic coefficients of bulk semiconductors are rather too small to be practical, requiring a 600 V bias for the same detuning of $$\Delta k = (k_{pump}^{TE} - k_{signal}^{TE} - k_{idler}^{TM})$$

by 0.20 $\mu m^{-1}$. On the other hand, quantum wells offer far more enhanced electro-optic effect compared to the bulk materials, especially just below the bandgap. The estimated required voltage is approximately 30 V for the IR tuning of 3 $\mu m$ to 4 $\mu m$. Quantum well designs will achieve idler tuning over a wide spectral range using the minimum bias voltage.

Figure 6:
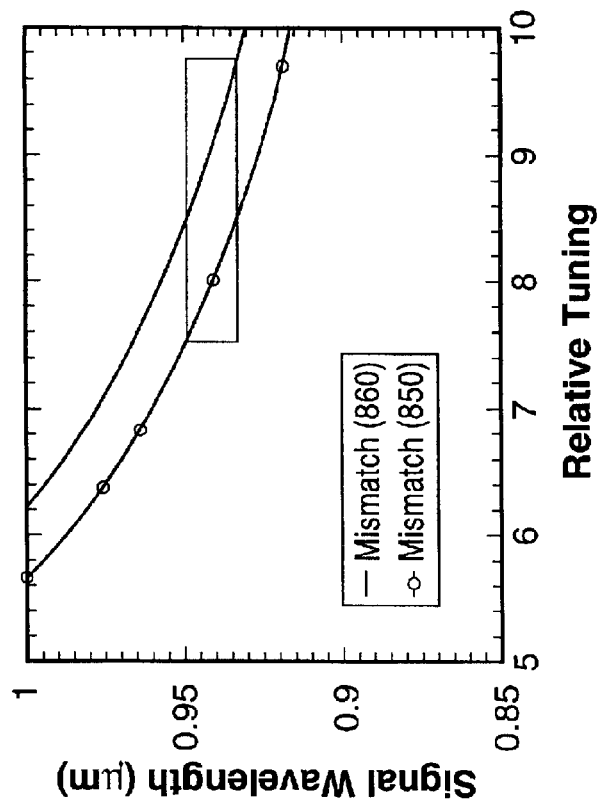
FIG. 6 is a graph similar to FIG. 5 that shows an expanded view for a signal wavelength tuning from 950 nm to 935 nm, tuning parameter tuning from 7.5 µm to 9.8 µm.
Figure 5:
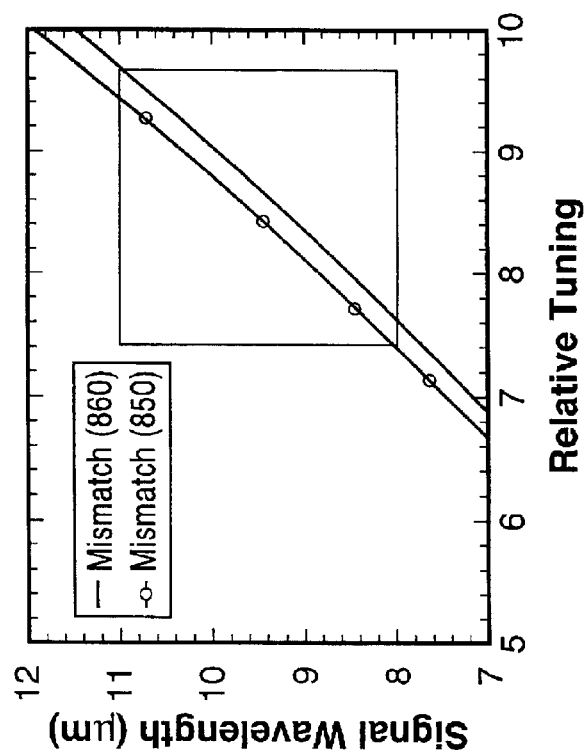
FIG. 5 is a graph similar to FIG. 3, repeated for idler tuning from 8 µm to 11 µm for tuning the pump from 850 nm to 860 nm.

While the foregoing discussion has focused on infrared generation in the approximate range of 3 $\mu m$ to 4 $\mu m$, devices covering other wavelength ranges such as 4 $\mu m$ to 6 $\mu m$, 6 $\mu m$ to 8 $\mu m$, and 8 $\mu m$ to 11 $\mu m$ can be designed in a similar manner. FIG. 5 and FIG. 6 show tuning curves for 8 $\mu m$ to 11 $\mu m$. FIG. 5 shows the idler tuning from 8 $\mu m$ to 11 $\mu m$ for tuning the pump from 850 nm to 860 nm, and the signal tuning from 950 nm to 935 nm is shown in FIG. 6. For this tuning, the relative tuning parameter must also change from 7.5 $\mu m$ to 9.8 $\mu m$ to correspond to tuning of the phase mismatch by 0.12 $\mu m^{-1}$, and the required current or bias voltage tuning is approximately half of the previous values calculated for 3 $\mu m$ to 4 $\mu m$ idler tuning.

3. Fabrication of Periodically Domain Inverted Waveguides

Figure 7:
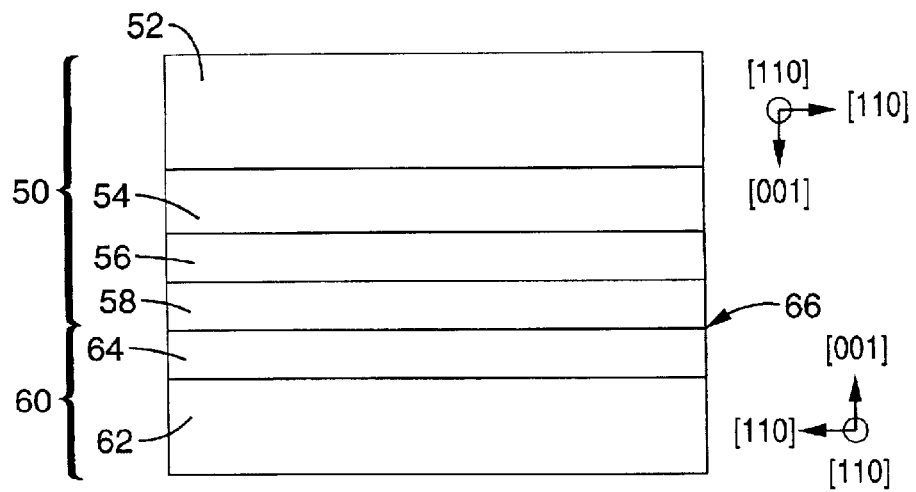
FIG. 7 is a schematic diagram in cross-section showing two wafers just before the wafer bonding step in a fabrication procedure for a quasi-phasematched waveguide with patterned crystal orientation as depicted in FIG. 1.

Referring now to FIG. 7, wafer-bonding, selective etching, and epitaxial regrowth are employed to realize a periodically domain inverted waveguide according to the invention. The design and fabrication techniques of the periodic-domain-reversed waveguide comprises those of a template and those of a waveguide. First, the template is prepared by bonding two [001] orientation Metal-Organic Chemical Vapor Deposition (MOCVD) grown wafers such that the [110] crystal directions of the two wafers are parallel to each other. The top wafer 50 comprises a GaAs substrate layer 52, a 1 $\mu m$ thick $Al_{0.8}Ga_{0.2}As$ layer 54, a 0.1 $\mu m$ thick GaAs layer 56, and a 200 Angstrom thick $In_{0.5}Ga_{0.5}P$ layer 58. The bottom wafer 60 comprises a GaAs substrate layer 62 and 200 Angstrom thick $In_{0.5}Ga_{0.5}P$ layer 64. The wafer bonding process will achieve an intimate atomic rearrangement at the bonding interface 66.

Figure 8:
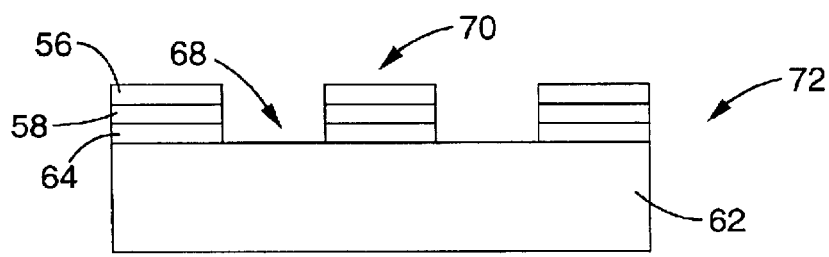
FIG. 8 is a schematic diagram in cross-section showing a patterned template formed after bonding of the wafers shown in FIG. 7 and after a grating is lithographically patterned and GaAs and InGaP layers are selectively etched to reveal a GaAs surface from the bottom substrate.

Referring now to FIG. 8, after the wafers are bonded, the upper GaAs substrate layer 52 and 1 $\mu m$ $Al_{0.8}Ga_{0.2}As$ sacrificial layer 54 are selectively etched away. Subsequent patterning of a grating and selective wet-etching steps will reveal a patterned template 72 having alternating GaAs surfaces 68 from the bottom substrate 62 and GaAs surfaces 70 from GaAs epitaxial layer 56 from the removed top wafer 50. Note that the grating lines extend in the [110] direction and the crystal domains alternate.

Figure 9:
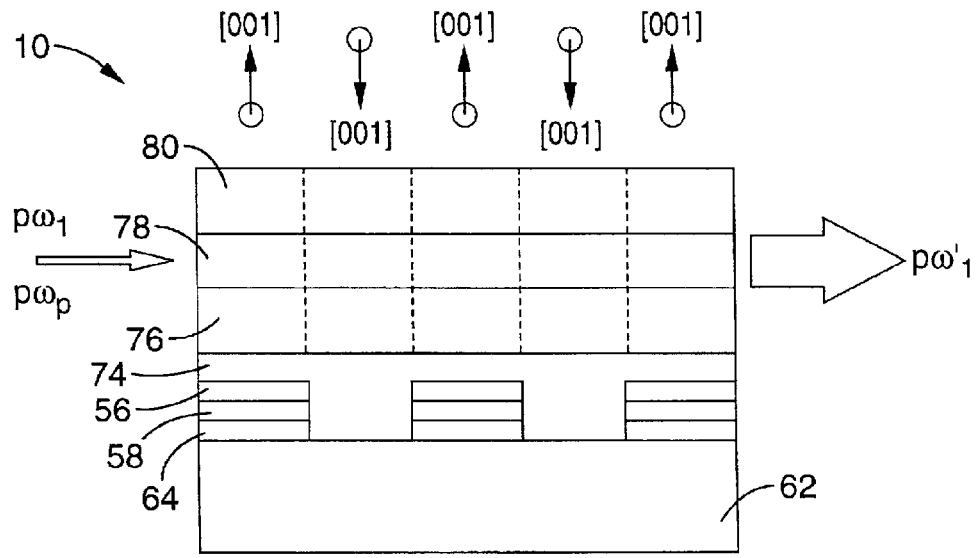
FIG. 9 is a schematic diagram in cross-section showing a quasi-phasematched waveguide with patterned crystal orientation as depicted in FIG. 1 after growth of a superlattice layer for planarization and a waveguide comprising a lower $Al_{0.6}Ga_{0.4}As$ cladding layer, an $Al_{0.5}Ga_{0.5}As$ core layer, and an $Al_{0.6}Ga_{0.4}As$ on the template shown in FIG. 8.

Referring to FIG. 9, the nonlinear AlGaAs waveguide 10 of the invention is then MOCVD grown on the patterned template 72. The waveguide comprises a planarization layer 74, a lower 2 $\mu m$ thick $Al_{0.6}Ga_{0.4}As$ cladding layer 76, a 1 $\mu m$ thick $Al_{0.5}Ga_{0.5}As$ core layer 78, and an upper 2 $\mu m$ thick $Al_{0.6}Ga_{0.4}As$ cladding layer 80. Subsequent patterning of a waveguide stripe and $Al_{0.6}Ga_{0.4}As$ regrowth yields a buried hetero waveguide. Note that the layer thicknesses shown in FIG. 9 are for a 1.5 $\mu m$ device used as a telecommunications wavelength converter in experiments. For the preferred infrared wavelengths described above, the layers would be thicker to give longer wavelength idlers.

Figure 11:
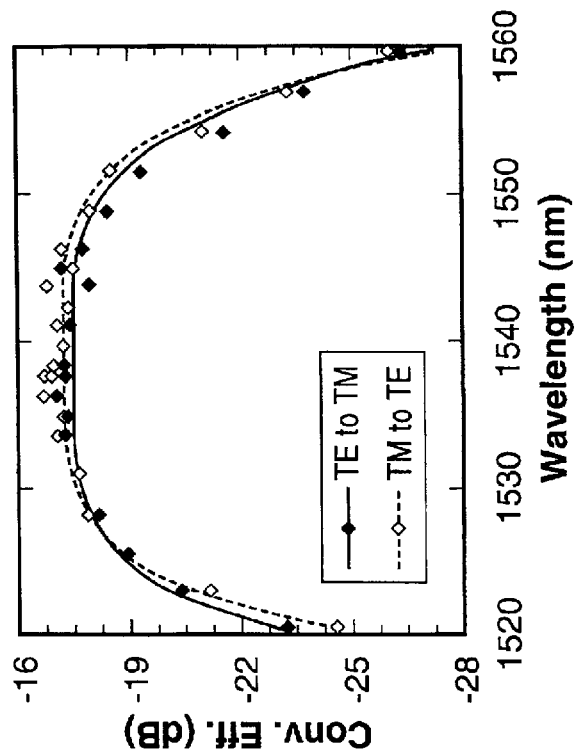
FIG. 11 is a graph showing measured conversion efficiency tuning curve for two conversion processes, TE conversion to TM and TM conversion to TE for a quasi-phasematched waveguide with patterned crystal orientation according to the present invention.
Figure 10:
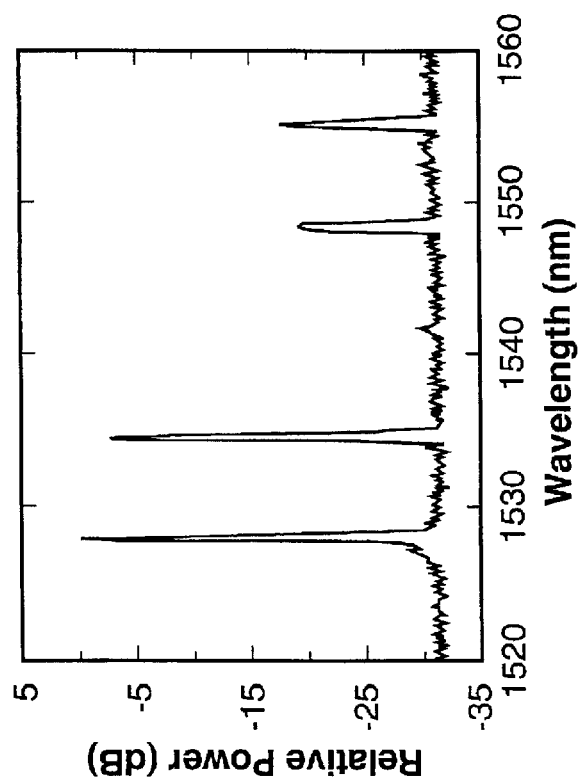
FIG. 10 is a graph showing an experimentally measured spectrum for simultaneous conversion of two input channels at 1528 nm and 1536 nm and converted waves at 1548 nm and 1556 nm for a quasi-phasematched waveguide with patterned crystal orientation according to the present invention.

FIG. 10 and FIG. 11 show experimental results from a device optimized for nearly-degenerate difference frequency generation in the 1550 nm region. In FIG. 10, a pump wave at 771 nm and two input signals at 1528 nm and 1536 nm are utilized to generate two idler waves at 1556 nm and 1548 nm. FIG. 11 shows the measured conversion efficiency tuning curve as the input signal is tuned from 1490 to 1610 nm. For the fixed pump wavelength and the QPM grating conditions, the measured bandwidth of the tuning curve exceeds 90 nm. The measured conversion efficiency was a relatively low −17 dB due to large scattering loss in the fabricated waveguide. This scattering loss was induced by corrugations in the waveguide due to imperfect planarization by the superlattice planarization layer. A −4 dB conversion efficiency with a reasonable loss level of 3 dB/cm and 100 mW pump power should be achievable. Utilizing an atomic-scale planarization method should significantly reduce the waveguide corrugation and the scattering loss.

Note that the quality of wafer-bonding is critical to achieving a low loss waveguide. This is addressed through wafer-scale wafer-bonding in a ultra-high vacuum bonding chamber and will be valuable in achieving a low loss waveguide with low defect density. While the wafer-scale bonding is generally very successful, the bonding interface can show air-pockets resulting from trapped gas and moisture. Therefore, by using an ultra-high vacuum so that there is no possibility of trapping gases or moisture at the bonding interface.

4. High Power Tunable Lasers

Figure 12:
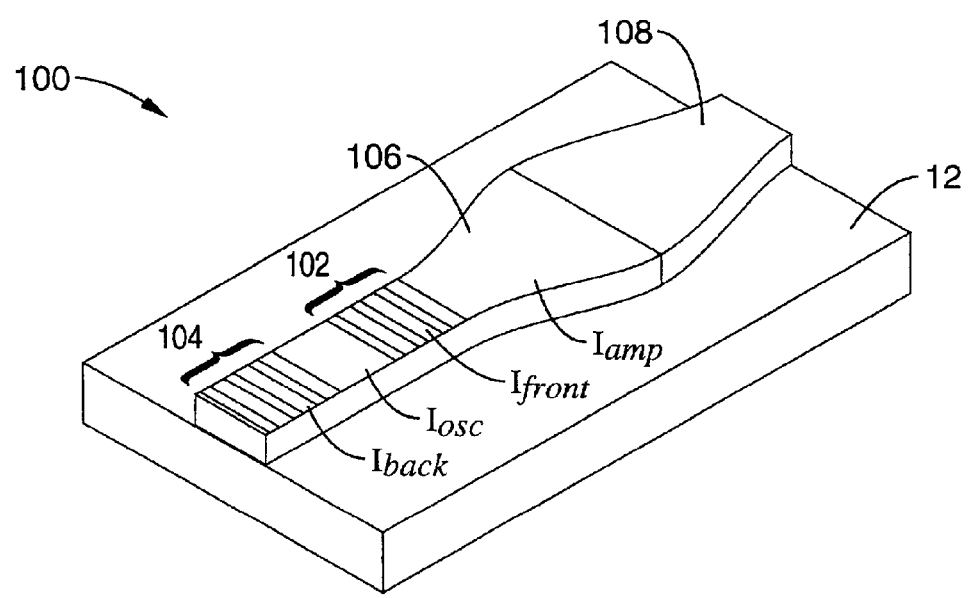
FIG. 12 is a schematic diagram of an embodiment of a high power tunable laser for integration into the structure shown in FIG. 2.
Figure 13:
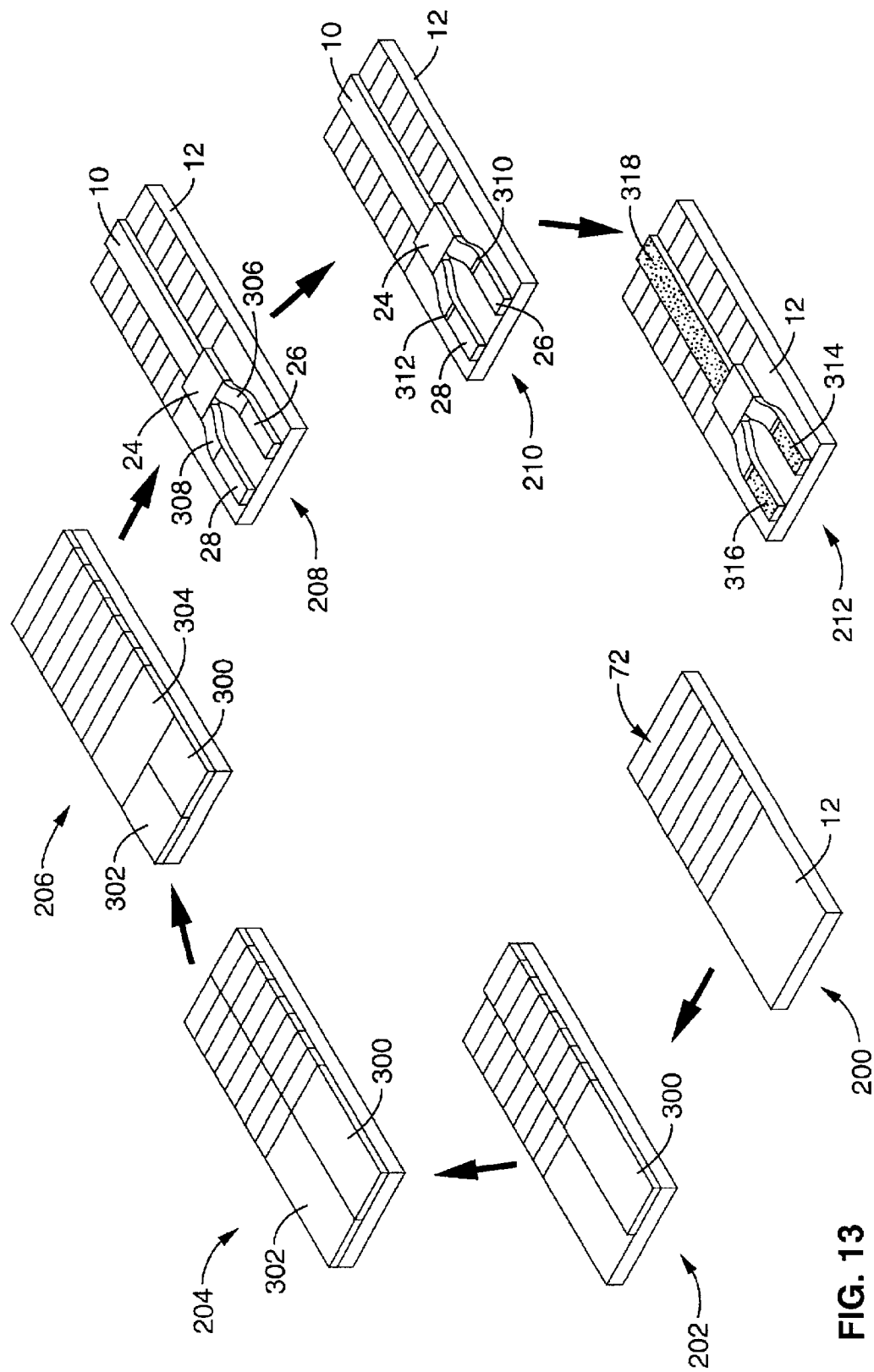
FIG. 13 is a flow diagram showing an embodiment of a device integration method according to the present invention.

Referring to FIG. 12, the present invention also contemplates integrating high-power widely tunable lasers with the nonlinear waveguide described above. Currently, tunable lasers using sampled grating Distributed-Bragg-Reflectors (DBR) appear to be suitable for this purpose. FIG. 12 shows a schematic of a high power tunable laser 100 to be integrated with the nonlinear waveguide 10 as part of the integrated device 22 shown in FIG. 2. This example shows a laser with front 102 and back 104 sampled grating DBRs, and a tapered amplifier section 106 for high power. The sampled gratings 102, 104 are fabricated by deep UV holographic exposure employing phase gratings. This fabrication technique will achieving a narrow linewidth lasing action (approximately 10 MHz) of the pump and the signal lasers for narrow linewidth idler emission in the infrared. In addition, strained quantum well designs could be employed to further broaden the gain spectral width while maintaining superior lasing performance. The output of the tunable laser will include a flared amplifier section 106 to achieve output power levels in the 1 W regime and above. The passive taper 108, only a portion of which is shown, is designed to reduce the size of the beam before it couples into the MMI 24 shown in FIG. 2, and is essentially a reverse process of the beam expansion in the flared amplifier 106. The self-aligned process described below in connection with FIG. 13 is used to align the flared-amplifier 106 and the passive taper waveguide 108 seamlessly.

5. MMI Coupler

Referring again to FIG. 2, the integrated device 22 shown therein employs an MMI 24 to achieve efficient coupling of the pump and the signal waves from the two tunable lasers 26, 28, respectively, into the nonlinear waveguide 10. In particular, the wavelength dependent MMI characteristics are exploited to achieve efficient coupling of both pump and signal waves into the nonlinear waveguide. For the embodiments of the present invention previously described, a 780 nm/980 nm coupler is used for a 3 $\mu m$ to 4 $\mu m$ device and a 850 nm/980 nm coupler is used for an 8 $\mu m$ to 11 $\mu m$ device. Conventional design procedures known to those skilled in the art are employed.

In this regard, note that MMI couplers are reasonably tolerant to fabrication errors and wavelength tunings, and preliminary calculations show less than 7% variations in the coupling efficiency for tuning the pump and the signal lasers by ±10 nm. Self-aligned dry etching processes are preferably used to precisely define the MMI coupler, the waveguide, and the tunable lasers. In addition, dry etching allows forming nearly vertical etched walls for both MMI couplers and waveguides, which provides improved mode overlap between interacting waves inside the waveguide.

6. Integration Process

FIG. 13 schematically shows an embodiment of device integration steps to form the integrated device 22 shown in FIG. 2, which include wafer bonding, template fabrication, MOCVD regrowth, self-aligned dry-etching, and metallization. The self aligned dry-etching removes the need to align the laser sections and the passive waveguide sections. This is important especially for the tapered high power laser shown in FIG. 12, since the multi-moded coupling region can cause unintentional multi-mode interference in the passive waveguide if the laser and the waveguide are not aligned properly.

In this integration process, dry etching is utilized for realizing vertical walls in the etched laser and waveguide sidewalls necessary for high quality integration and MOCVD regrowths. Each dry etching step is followed by a wet etching step to remove materials damaged from dry etching processes.

The integration process preferably proceeds follows. First, at step 200 the domain inverted template 72 (see FIG. 8) is fabricated on a substrate employing the procedure for fabricating periodically-domain-inverted waveguides shown in FIG. 7 through FIG. 9 and described above. Second, at step 202 the pump laser structure 300 is grown on the template and is partially removed to allow growth of a signal laser structure. Third, at step 204 the signal laser structure 302 is grown and is partially removed where the pump laser structure 300 exists. Fourth, at step 206 the sequence involves dry etching followed by wet etching of the laser structures where the passive waveguide structure 304 needs to be grown and then excessive growth on the laser region is wet etched. Fifth, at step 208 laser 26, 28 and passive waveguide 306, 308 regions are patterned using a self-aligning mask process and are dry etched, and the MMI 24 is deposited. Sixth, at step 210 holographic gratings 310, 312 for the sampled grating lasers are be patterned. In the final step 212, contact layer regrowth and metallization takes place to deposit contacts 314, 316, 318.

Preferably, the present invention employs a compliant substrate 12 fabricated by using the wafer-bonding process. The compliant substrate preferably includes a thin and elastic GaAs membrane on top surface to accommodate epitaxial growth of zinc-blende semiconductors of any lattice constant. This offers two major improvements for Type-II devices. First, GaAs provides far superior surface chemistry compared to GaSb. Second, Type-II quantum wells with various lattice constants can be investigated for superior performance in both lasers and detector applications. Wafer-bonding technology offers a high-quality compliant substrate where a thin layer of GaAs membrane can accommodate subsequent epitaxial growth of materials of any lattice constant.

Figure 14:
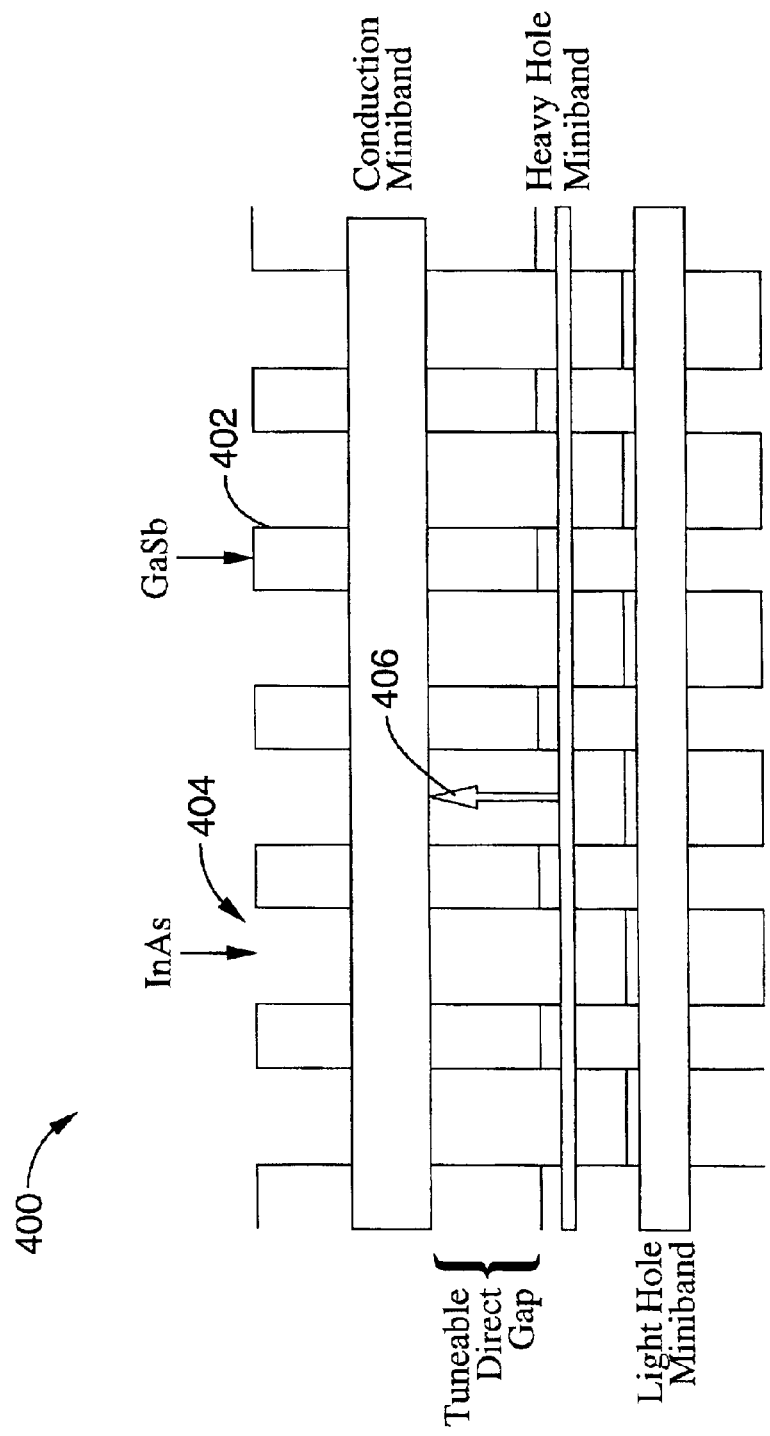
FIG. 14 is a schematic diagram in cross-section of a short period InAs/GaSb superlattice structure.

Note that some IR detector work exploits Type-II alignment of InAs/GaSb quantum wells for IR detectors. FIG. 14 shows an example of a Type-II structure 400 used for the IR detector application. Short period superlattices of InAs/GaSb lead to the formation of conduction and valence minibands. In these band states, heavy holes are largely confined to the GaSb layers 402 and electrons are primarily confined to the InAs layers 404. However, because of the relatively low electron mass in InAs, the electron wavefunctions extend considerably beyond the interfaces and have significant overlap with heavy hole wavefunctions. Hence, significant absorption is possible at the minigap energy (shown in FIG. 14 with the vertical arrow 406) which is tunable by changing layer thickness. Cutoff wavelengths between approximately 3 µm and approximately 18 µm are possible with this system. Additionally, since the gap of each constituent material is larger than the effective direct gap of the superlattice, dark currents are suppressed in comparison with their values in similar cutoff wavelength bulk ternary alloys such as HgCdTe. Another benefit of this structure for detector applications is that normal incidence absorption is permitted by selection rules, obviating the need for grating structures or corrugations which are needed in quantum well infrared photodetectors (QWIPs). Finally, Auger transition rates, which place intrinsic limits on the performance of such detectors and severely impact the lifetimes found in the bulk, narrow-gap detectors, can be engineered "small" by judicious choices for the structure's geometry and strain profile.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An infrared source, comprising:
   a tunable signal laser;
   a tunable pump laser; and
   a non-linear optical semiconductor waveguide coupled to said lasers, said waveguide comprising a plurality of optical semiconductor waveguide segments having alternating crystal orientation;
   wherein output wavelength is tunable by tuning at least one of said signal and pump lasers;
   wherein said waveguide provides quasi-phasematching of output signals from said signal and pump lasers; and
   wherein said quasi-phasematching is electrically tunable by injection of a current into said waveguide or by applying an electrical bias voltage to said waveguide.

2. An infrared source as recited in claim 1, wherein pump and signal waves injected into said waveguide mix to generate an idler wave by difference frequency mixing.

3. An infrared source as recited in claim 1, wherein said segments comprise GaAs having alternating reversed [110] crystal directions.

4. An infrared source as recited in claim 1, wherein said segments comprise InP having alternating reversed [110] crystal directions.

5. An infrared source as recited in claim 1, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer.

6. An infrared source as recited in claim 5, wherein said upper cladding layer is approximately 2 $\mu$m thick, said core layer is approximately 1 $\mu$m thick, and said lower cladding layer is approximately 2 $\mu$m thick.

7. An infrared source as recited in claim 1, wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on a GaAs substrate.

8. An infrared source as recited in claim 7, wherein said upper cladding layer is approximately 2 $\mu$m thick, said core layer is approximately 1 $\mu$m thick, and said lower cladding layer is approximately 2 $\mu$m thick.

9. An infrared source as recited in claim 7, wherein said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

10. An infrared source as recited in claim 1, wherein at least one segment comprises an upper $Al_{0.6}Ga_{0.4}As$ cladding layer, a $Al_{0.6}Ga_{0.4}As$ core layer, and a lower $Al_{0.6}Ga_{0.4}As$ cladding layer on a GaAs substrate layer, and wherein at least one segment comprises an upper $Al_{0.6}Ga_{0.4}As$ cladding layer, a $Al_{0.6}Ga_{0.4}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on said GaAs substrate.

11. An infrared source as recited in claim 10, wherein said upper cladding layer is approximately 2 $\mu$m thick, said core layer is approximately 1 $\mu$m thick, and said lower cladding layer is approximately 2 $\mu$m thick.

12. An infrared source as recited in claim 10, wherein said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

13. An infrared source as recited in said upper cladding layer is approximately 2 $\mu$m thick, said core layer is approximately 1 $\mu$m thick, said lower cladding layer is approximately 2 $\mu$m thick, said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

14. An infrared source, comprising:
   a tunable signal laser;
   a tunable pump laser; and
   a non-linear optical semiconductor waveguide coupled to said lasers, said waveguide comprising a plurality of periodic domain inverted semiconductor waveguide segments;
   wherein output wavelength is tunable by tuning at least one of said signal and pump lasers;
   wherein said waveguide provides quasi-phasematching of output signals from said signal and pump lasers; and
   wherein said quasi-phasematching is electrically tunable by injection of a current into said waveguide or by applying an electrical bias voltage to said waveguide.

15. An infrared source as recited in claim 14, wherein pump and signal waves injected into said waveguide mix to generate an idler wave by difference frequency mixing.

16. An infrared source as recited in claim 14, wherein said segments comprise GaAs having alternating reversed [110] crystal directions.

17. An infrared source as recited in claim 14, wherein said segments comprise InP having alternating reversed [110] crystal directions.

18. An infrared source as recited in claim 14, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer.

19. An infrared source as recited in claim 18, wherein said upper cladding layer is approximately 2 $\mu$m thick, said core layer is approximately 1 $\mu$m thick, and said lower cladding layer is approximately 2 $\mu$m thick.

20. An infrared source as recited in claim 14, wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}As$ layer, and a lower $In_{0.5}Ga_{0.5}P$ layer on a GaAs substrate.

21. An infrared source as recited in claim 20, wherein said upper cladding layer is approximately 2 $\mu$m thick, said core layer is approximately 1 $\mu$m thick, and said lower cladding layer is approximately 2 $\mu$m thick.

22. An infrared source as recited in claim 20, wherein said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

23. An infrared source as recited in claim 14, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer, and wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on said GaAs substrate.

24. An infrared source as recited in claim 23, wherein said upper cladding layer is approximately 2 $\mu$m thick, said core layer is approximately 1 $\mu$m thick, and said lower cladding layer is approximately 2 $\mu$m thick.

25. An infrared source as recited in claim 23, wherein said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

26. An infrared source as recited in claim 23, wherein said upper cladding layer is approximately 2 $\mu$m thick, said core layer is approximately 1 $\mu$m thick, said lower cladding layer is approximately 2 $\mu$m thick, said GaAs layer is approximately 0.1 $\mu$m thick, said upper $In_{0.5}Ga_{0.5}P$ layer is approximately 200 Angstroms thick, and said lower $In_{0.5}Ga_{0.5}P$ layer is approximately 200 Angstroms thick.

27. An infrared source, comprising:
   (a) a tunable signal laser;
   (b) a tunable pump laser; and
   (c) means for quasi-phasematching of output signals from said signal and pump lasers, wherein said quasi-phasematching is electrically tunable.

28. An infrared source as recited in claim 27, wherein said infrared source generates an output signal by difference frequency mixing of input signals from said pump and signal lasers, and wherein tuning a said one of said lasers adjusts the wavelength of the output signal.

29. An infrared source as recited in claim 27, wherein at least one of said lasers comprises a tunable laser with sampled distributed Bragg grating.

30. An infrared source as recited in claim 27, wherein said means for quasi-phasematching of output signals from said signal and pump lasers comprises:

a non-linear optical semiconductor waveguide;

said waveguide comprising a plurality of optical semiconductor waveguide segments having alternating crystal orientation;

wherein said quasi-phasematching is electrically tunable by injection of a current into said waveguide or by applying an electrical bias voltage to said waveguide.

31. An infrared source as recited in claim 27, wherein said segments comprise GaAs having alternating reversed [110] crystal directions.

32. An infrared source as recited in claim 27, wherein said segments comprise InP having alternating reversed [110] crystal directions.

33. Infrared source as recited in claim 27, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer.

34. An infrared source as recited in claim 33, wherein said upper cladding layer is approximately 2 μm thick, said core layer is approximately 1 μm thick, and said lower cladding layer is approximately 2 μm thick.

35. An infrared source as recited in claim 27, wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on a GaAs substrate.

36. An infrared source as recited in claim 35, wherein said upper cladding layer is approximately 2 μm thick, said core layer is approximately 1 μm thick, and said lower cladding layer is approximately 2 μm thick.

37. An infrared source as recited in claim 35, wherein said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

38. An infrared source as recited in claim 27, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer, and wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on said GaAs substrate.

39. An infrared source as in claim 38, wherein said upper cladding layer is approximately 2 μm thick, said core layer is approximately 1 μm thick, and said lower cladding layer is approximately 2 μm thick.

40. An infrared source as recited in claim 38, wherein said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

41. An infrared source as recited in claim 38, wherein said upper cladding layer is approximately 2 μm thick, said core layer is approximately 1 μm thick, said lower cladding layer is approximately 2 μm thick, said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

42. A tunable infrared source, comprising:

(a) a tunable signal laser;

(b) a tunable pump laser; and (c) a non-linear optical semiconductor waveguide, said waveguide comprising a plurality of optical semiconductor waveguide segments having alternating crystal orientation;

(d) wherein pump and signal waves injected into said waveguide mix to generate an idler wave by difference frequency mixing;

(e) wherein said infrared source generates an output signal by difference frequency mixing of input signals from said pump and signal lasers, and wherein tuning a said one of said lasers adjusts the wavelength of the output signal;

(f) wherein said waveguide provides quasi-phasematching of output signals from said signal and pump lasers; and (g) wherein said quasi-phasematching is electrically tunable by injection of a current into said waveguide or by applying an electrical bias voltage to said waveguide.

43. An infrared source as recited in claim 42, further comprising a multi-mode-interference coupler between said waveguide and said signal and pump lasers.

44. An infrared source as recited in claim 42, wherein at least one of said lasers includes a sampled distributed Bragg grating.

45. An infrared source as recited in claim 42, wherein said segments comprise GaAs having alternating reversed [110] crystal directions.

46. An infrared source as recited in claim 42, wherein said segments comprise InP having alternating reversed [110] crystal directions.

47. An infrared source as recited in claim 42, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer.

48. An infrared source as recited in claim 47, said upper cladding layer is approximately 2 μm thick, said core layer is approximately 1 μm thick, and said lower cladding layer is approximately 2 μm thick.

49. An infrared source as recited in claim 42, wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on a GaAs substrate.

50. An infrared source as recited in claim 49, wherein said upper cladding layer is approximately 2 μm thick, said core layer is approximately 1 μm thick, and said lower cladding layer is approximately 2 μm thick.

51. An infrared source as recited in claim 49, wherein said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

52. An infrared source as recited in claim 42, wherein at least one segment comprises an upper $Al_{0.6}Ga_{0.4}As$ cladding layer, a $Al_{0.5}Ga_{0.5}As$ core layer, and a lower $Al_{0.6}Ga_{0.4}As$ cladding layer on a GaAs substrate layer, and wherein at least one segment comprises an upper $Al_{0.6}Ga_{0.4}As$ cladding layer, a $Al_{0.5}Ga_{0.5}As$ core layer, a lower $Al_{0.6}Ga_{0.4}As$ cladding layer, a GaAs layer, an upper $In_{0.5}Ga_{0.5}P$ layer, and a lower $In_{0.5}Ga_{0.5}P$ layer on said GaAs substrate.

53. An infrared source as recited in claim 52, wherein said upper cladding layer is approximately 2 μm thick, said core layer is approximately 1 μm thick, and said tower cladding layer is approximately 2 μm thick.

54. An infrared source as recited in claim 52, wherein said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

55. An infrared source as recited in claim 52, wherein said upper cladding layer is approximately 2 μm thick, said core layer is approximately 1 μm thick, said lower cladding layer is approximately 2 μm thick, said GaAs layer is approximately 0.1 μm thick, said upper $In_{0.5}Ga_{0.5}P$ layer is approximately 200 Angstroms thick, and said lower $In_{0.5}Ga_{0.5}P$ layer is approximately 200 Angstroms thick.

* * * * *